United States Patent
Mandell et al.

(10) Patent No.: US 7,307,338 B1
(45) Date of Patent: Dec. 11, 2007

(54) THREE DIMENSIONAL POLYMER MEMORY CELL SYSTEMS

(75) Inventors: Aaron Mandell, Boston, MA (US); Juri H Krieger, Brookline, MA (US); Igor Sokolik, East Boston, MA (US); Richard P Kingsborough, Acton, MA (US); Stuart Spitzer, Lynnfield, MA (US)

(73) Assignee: Spansion LLC, Sunnyvale, CA (US)

( * ) Notice: Subject to any disclaimer, the term of this patent is extended or adjusted under 35 U.S.C. 154(b) by 39 days.

(21) Appl. No.: 10/899,344

(22) Filed: Jul. 26, 2004

(51) Int. Cl.
*H01L 23/58* (2006.01)

(52) U.S. Cl. .............. 257/643; 257/40; 257/642; 257/E29.17; 257/E51.023; 257/E21.024; 257/E27.104

(58) Field of Classification Search ........... 257/744, 257/758, 759, 745, 762, 642, 40, 643, E29.17, 257/E51.023, E21.024, E27.104
See application file for complete search history.

(56) References Cited

U.S. PATENT DOCUMENTS

| | | | |
|---|---|---|---|
| 6,798,068 B2 * | 9/2004 | Oglesby | 257/759 |
| 6,885,573 B2 * | 4/2005 | Sharma et al. | 365/105 |
| 2006/0002168 A1 * | 1/2006 | Krieger et al. | 365/115 |

* cited by examiner

*Primary Examiner*—Andy Huynh
(74) *Attorney, Agent, or Firm*—Amin, Turocy & Calvin, LLP

(57) ABSTRACT

Systems and methodologies are provided for forming three dimensional memory structures that are fabricated from blocks of individual polymer memory cells stacked on top of each other. Such a polymer memory structure can be formed on top of control component circuitries employed for programming a plurality of memory cells that form the stacked three dimensional structure. Such an arrangement provides for an efficient placement of polymer memory cell on a wafer surface, and increases amount of die space available for circuit design.

18 Claims, 9 Drawing Sheets

US 7,307,338 B1

THREE DIMENSIONAL POLYMER MEMORY CELL SYSTEMS

TECHNICAL FIELD

The present invention relates generally to memory cell group structures, and in particular to a three dimensional memory structure stack that groups polymer memory cell blocks together.

BACKGROUND OF THE INVENTION

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums.

Also, memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Examples of non-volatile memory cells include; ROM, programmable read only memory (PROM), erasable programmable read only memory (EPROM), electrically erasable programmable read only memory (EEPROM), flash EEPROM and the like. Volatile memory cells generally provide faster operation at a lower cost as compared to non-volatile memory cells. Nonetheless, to retain the information, the stored data typically must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

As such, each memory cell in a memory device can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase speed and storage retrieval for memory devices (e.g., increase write/read speed). At the same time, to reach high storage densities, manufacturers typically focus on scaling down semiconductor device dimensions (e.g., at sub-micron levels). Nonetheless, as the size of inorganic solid state devices decreases and integration increases, sensitivity to alignment tolerances can also increase making fabrication markedly more difficult. Moreover, formation of features at small minimum sizes does not imply that the minimum size can be used for fabrication of working circuits. Furthermore, such shrinkage for inorganic non-volatile memory cells, can be particularly difficult to do while maintaining low costs. Accordingly, silicon-based devices are approaching their fundamental physical size limits, and further device shrinking and density increasing may be limited for such memory cells.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter.

The present invention provides for systems and methods of forming three dimensional memory structures that are fabricated from blocks of individual polymer memory cells grouped into a non-horizontal arrangement, and which are programmable via a control component coupled thereto. Such a polymer memory structure can be formed in a vertical stack, for example, with each polymer memory cell acting as base for a subsequent polymer cell to be formed thereupon. According to one aspect of the present invention, polymer memory cells shaping such an arrangement can include various layers of alternating passive and active media, which are sandwiched between conducting electrode layers. Such active and passive layers facilitate migration of charges (e.g. electron and/or positive ions) between electrodes to induce a desired programming state (e.g. a write) in the polymer memory cell. Interconnecting vias can be employed to operatively tie various layers of one or more memory cells together. The three dimensional memory structure of the present invention can also be part of an array arrangement that can include a plurality of rows and columns. This provides for an efficient placement of polymer memory cell on a wafer surface, and increases amount of die space available for circuit design.

In a related aspect, polymer memory cell layers can also be placed upon the control component circuitries employed to program such memory cell(s). Such control component can send signals that can switch memory cell states depending upon an impedance of the memory cell. For example, the control circuit can send an electric current pulse over a predetermined threshold to write the memory cell.

Furthermore, as part of the three dimensional stacked structures and according to a further aspect of the present invention, various partitioning components can be provided that can separate the individual memory cells of the memory cell stack from one another, e.g. through voltage or current isolation. Such components can include various diode units, isolation parts, thin film transistors, and the like.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings.

To facilitate the reading of the drawings, some of the drawings may not have been drawn to scale from one figure to another or within a given figure.

DETAILED DESCRIPTION OF THE INVENTION

Figure 1:
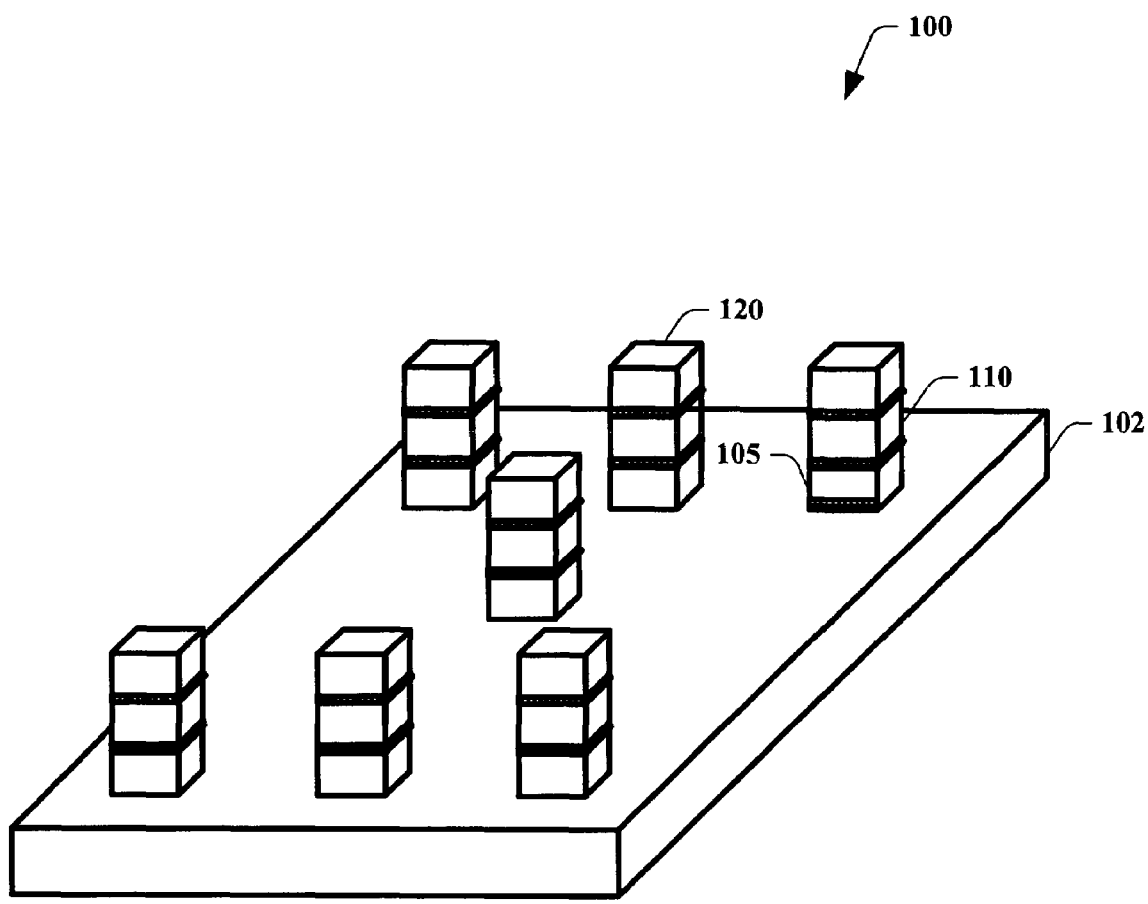
FIG. 1 is a perspective view of three dimensional memory stacks that group memory cells together on a wafer surface, according to one aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

Referring initially to FIG. 1, a perspective diagram of a system 100 is depicted, which is formed on a wafer surface 102, from blocks of individual polymer cells 110 positioned on top of each other to form stacked group 120. Such stacked group 120 can comprise N number of memory cells (N being an integer), programmable via control component (e.g. circuitry 105). Stacking memory cells according to the present invention increases amount of die space available for circuit design, and thus provides for an efficient placement of polymer memory cell on surface of a wafer. At the same time, a memory device with a short resistance switch time and low operating voltages can be created, which is also compatible with manufacturing methodologies for existing semiconductors.

Typically, each memory cell 110 of the stacked group 120 can accept and maintain a plurality of states, in contrast to a conventional memory device that is limited to two states (e.g., off or on). Accordingly, each memory cell 110 can employ varying degrees of conductivity to identify additional states. For example, the memory cells can have a very highly conductive state (very low impedance state), a highly conductive state (low impedance state), a conductive state (medium level impedance state), and a non-conductive state (high impedance state) thereby enabling the storage of multiple bits of information in a single memory cell, such as 2 or more bits of information or 4 or more bits of information (e.g., 4 states providing 2 bits of information, 8 states providing 3 bits of information and the like.)

Switching a memory cell of the stacked group 100 to a particular state is referred to as programming or writing. For example, programming can be accomplished by applying a particular voltage (e.g., 9 volts, 2 volts, 1 volt, . . . ) across selected layers of the memory cell, as described in detail infra. Such particular voltage, also referred to as a threshold voltage, can vary according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the particular memory cell to be programmed, the thickness of the various layers, and the like. It is to be appreciated that FIG. 1 depicts a schematic diagram of a cubicle pillared memory stack for illustration purposes, and various other configurations are within a realm of the present invention.

Figure 2:
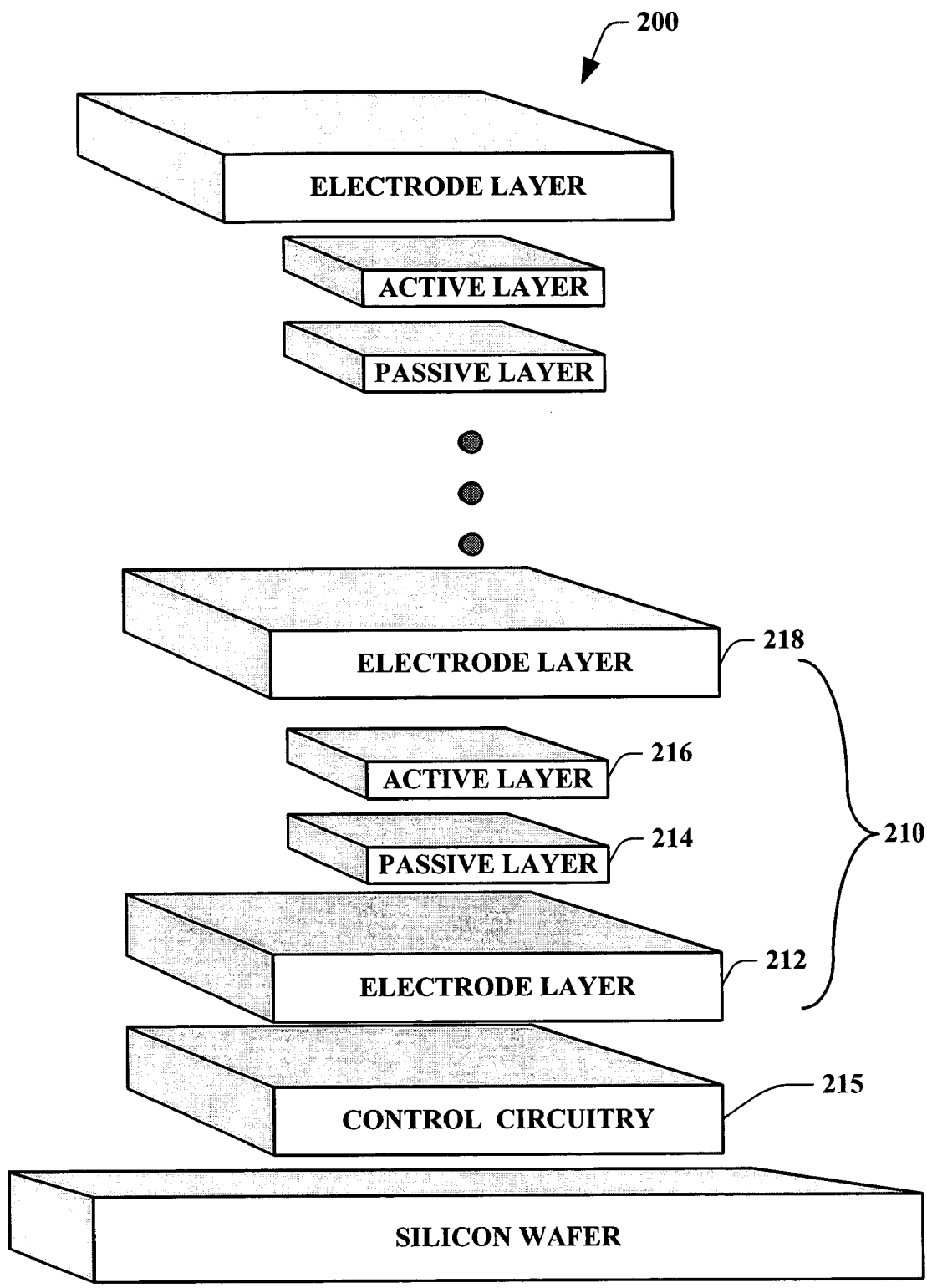
FIG. 2 depicts a perspective view of various layers in a three dimensional memory stack.

FIG. 2 illustrates a broken perspective of a stacked group of memory cells in accordance with an aspect of the present invention. The stacked memory cell structure 200 is formed from blocks of memory cells 210 positioned on a control circuitry 215 that can regulate a programming state of the memory-cell blocks (e.g. 210). The memory cell 210 includes an electrode layer 212, a passive layer 214 an active layer 216 and a further electrode layer 216. Unlike conventional inorganic memory cells that can maintain only two states, the memory cell 210 is capable of maintaining two or more states. Thus, a single cell of the memory stack 200 can hold one or more bits of information. Furthermore, the memory cell 210 is a non-volatile memory cell and consequently, does not require a constant or nearly constant power supply.

The electrode 212 can be formed by depositing a first conductive material over control circuitry 215 that controls programming of the polymer memory cells, or by directly depositing the first conductive layer over a substrate of silicon wafer. Trenches and/or vias can be formed in the substrate, e.g. as part of the control circuitry 215, prior to deposition of such conductive material followed by selectively depositing the first conductive material into the trenches. According to one aspect of the present invention, the electrodes 212, 218 can comprise; tungsten, silver, copper, titanium, chromium, cobalt, tantalum, germanium, gold, aluminum, magnesium, manganese, indium, iron, nickel, palladium, platinum, zinc, alloys thereof, indium-tin oxide, other conductive and semiconducting metal oxides, nitrides and silicides, polysilicon, doped amorphous silicon, and various metal composition alloys. In addition, other doped or undoped conducting or semi-conducting polymers, oligomers or monomers, such as PEDOT/PSS, polyaniline, polythiothene, polypyrrole, their derivatives, and the like can be used for electrodes. In addition, since some metals can have a layer of oxide formed thereupon that can adversely affect the performance of the memory cell, non-metal material such as amorphous carbon can also be employed for electrode formation. Also, other conductive polymers and/or optically transparent oxide or sulfide material can be employed in forming the electrodes 212, and 218.

As illustrated in FIG. 2, sandwiched between the two electrodes 212, 218, are a plurality of layers comprising organic, metal organic, and non-organic materials, in the form of an active layer 216 and a passive layer 214.

The passive layer 214 is operative to transport charge from the electrode 212 to the interface between the active layer 216 and the passive layer 214. Additionally, the passive layer 214 facilitates charge carrier (e.g., electrons or holes) and/or metal ion injection into the active layer 216, and increases the concentration of the charge carrier and/or metal ions in the active layer 216 resulting in a modification of the conductivity of the active layer 216. Furthermore, the passive layer 214 can also store opposite charges in the passive layer 214 in order to balance the total charge of the polymer cell 210. Each of the passive layer 214 and the active layer 216 can comprise further sub layers (not shown.)

The passive layer 214 can contain at least one conductivity facilitating compound that has the ability to donate and accept charges (holes and/or electrons). Generally, the conductivity facilitating compound has at least two relatively stable oxidation-reduction states that can permit the conductivity facilitating compound to donate and accept charges. Passive layer 214 can also be capable of donating and accepting ions. Examples of other conductivity facilitating compounds that can be employed for the passive layer 214 include one or more of the following: tungsten oxide ($WO_3$), molybdenum oxide ($MoO_3$), titanium dioxide ($TiO_2$), copper sulfide ($Cu_xS$), silver sulfide ($Ag_2S$) and the like.

In some instances, the passive layer 214 can act as a catalyst when forming the active layer 218 thereupon. In this connection, a backbone of a conjugated organic molecule can initially form adjacent to the passive layer 214, and grow or assemble away and substantially perpendicular to the passive layer surface. As a result, the backbones of the conjugated organic molecule can be self-aligned in a direction that traverses the two electrodes. The passive layer can be formed by a deposition process (e.g. thermal deposition, PVD, non-selective CVD, and the like) or by a complete sulfidation of pre-deposited thin Cu layer.

Referring now to the active layer 216, such layer can include various organic, metalorganic and non-organic conjugated monomers, olygomers and polymers. Moreover, additional material with donor/acceptor moieties such as; molecules and/or ions with large electric dipole element, polymer ferroelectrics, charge-transfer complexes, organic and inorganic salts, non-organic ferro-electrics, molecules that can dissociate in an electric field can also be employed as part of the active layer. As such, examples of organic, non-organic salts, alkalis, acids and molecules that can dissociate in an electric field and/or under light radiation can include the following anions: I, Br, Cl, F, $ClO_4$, $AlCl_4$, $PF_6$, $AsF_6$, $AsF_4$, $SO_3CF_3$, $BF_4$, $BCl_4$, $NO_3$, $POF_4$, CN, $SiF_3$, $SiF_6$, $SO_4$, $CH_3CO_2$, $C_6H_5CO_2$, $CH_3C_6H_4SO_3$, $CF_3SO_3$, $N(SO_3CF_3)_2$, $N(CF_3SO_2)(C_4F_9SO_2)$, $N(C_4F_9SO_2)_2$, alkylphosphate, organoborate, bis-(4-nitrophenil) sulfonilimide, poly(styrene sulfonate)(polyanions)—and for cations such as: Li, Na, K, Rb, Cs, Ag, Ca, Mg, Zn, Fe, Cu, H, $NH_4$ and the like. Similarly, examples of clusters employed in the active layer 216 that are based on polymer ferro electrics and non-organic ferro-electrics can include poly(vinylidene fluoride), poly(vinylidene fluoride)/trifluoroethylene, and the like.

According to another aspect of the present invention, various porous dielectric materials can also be employed as part of the active layer 216 and the passive layer 214. Such porous material for example, can include matter selected from the group of Si, amorphous Si, silicon dioxide ($SiO_2$), aluminum oxide ($Al_2O_3$), copper oxide ($Cu_2O$), titanium dioxide ($TiO_2$), boron nitride (BN), vanadium oxide ($V_2O_3$), carbon tri-nitride ($CN_3$), and ferroelectric materials, including barium-strontium titanate ((Ba, Sr) $TiO_3$).

Also, the active layer 216 of the memory cell 210 can include polymers with variable electric conductivity. Such polymers with variable electrical conductivity can include; polydiphenylacetylene, poly(t-butyl)diphenylacetylene, poly(trifluoromethyl)diphenylacetylene, polybis-trifluoromethyl)acetylene, polybis(t-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitro-phenylacetylene, poly(trifluoromethyl)phenylacetylene, poly(trimethylsilyl)pheylacetylene, polydipyrrylmethane, polyindoqiunone, polydihydroxyindole, polytrihydroxyindole, furane-polydihydroxyindole, polyindoqiunone-2-carboxyl, polyindoqiunone monohydrate, polybenzobisthiazole, poly(p-phenylene sulfide) and derivatives with active molecular group.

As used in this application, an active molecule or molecular group can be one that changes a property when subjected to an electrical field or light radiation, (e.g. ionizable group); such as: nitro group, amino group, cyclopentadienyl, dithiolane, metilcyclopentadienyl, fulvalenediyl, indenyl, fluorenyl, cyclobis(paraquart-p-phenylene), bipyridinium, phenothiazine, diazapyrenium, benzonitrile, benzonate, benzamide, carbazole, dibenzothiophene, nitrobenzene, aminobenzenesulfonate, amonobenzanate,), bipyridyl, bithienyl, thienyl, pyridyl, phenantryl, dialkylbenzyl, and aminobenzoate, and co-polymers of thereof, and molecular units with redox-active metals; metallocenes (Fe, V, Cr, Co, Ni and the like) complex, polypyridine metal complex (Ru, Os and the like)

In another aspect of the present invention, the active layer 216 can include polymers such as polyaniline, polythiophene, polypyrrole, polysilane, polystyrene, polyfuran, polyindole, polyazulene, polyphenylene, polypyridine, polybipyridine, polyphthalocyanine, polysexithiofene, poly(siliconoxohemiporphyrazine), poly(germaniumoxohemiporphyrazine), poly(ethylenedioxythiophene) and related derivatives with active molecular group. It is to be appreciated that other suitable and related chemical compounds can also be employed including: aromatic hydrocarbons; organic molecules with donor and acceptor properties (N-Ethylcarbazole, tetrathiotetracene, tetrathiofulvalene, tetracyanoquinodimethane, tetracyanoethylene, cloranol, dinitro-n phenyl and so on); metallo-organic complexes (bisdiphenylglyoxime, bisorthophenylenediimine, tetraazatetramethylannulene and so on); porphyrin, phthalocyanine, hexadecafluoro phthalocyanine and their derivatives with active molecular group.

In general, the memory cell stack 200 employing the material discussed supra can exhibit a formation of high conductivity areas, or affect a resistance of the passive and active layers in response to an external stimulus such as an electric voltage, electric current, light radiation, and the like. For example, presence of ferro-electric material can increase internal electric field intensity, and as a result application of a lower external electric voltage can be required for a writing of the memory 210. As explained supra, the active layer 216 can be created on the passive layer 214 and results in an interface between the two layers. Moreover, the active layer 216 can be formed via a number of suitable techniques. One such technique involves growing the active layer 216 in the form of an organic layer from the passive layer 214. Another technique that can be utilized is a spin-on technique, which involves depositing a mixture of the material and a solvent, and then removing the solvent from the substrate/electrode. A further suitable technique is chemical vapor deposition (CVD). CVD includes low-pressure chemical vapor deposition (LPCVD), plasma enhanced chemical vapor deposition (PECVD), and high density chemical vapor deposition (HDCVD). Another technique can be physical vacuum deposition. Additionally, the technique of atomic layer deposition (ALD) can also be employed. It is not typically necessary to functionalize one or more ends of the organic molecule in order to attach it to an electrode/passive layer. A chemical bond can also be formed between the conjugated organic polymer of the active layer 216 and the passive layer 214.

In one aspect of the present invention, the active layer 216 can also be comprised of a conjugated organic material, such as a small organic molecule and a conjugated polymer. If the organic layer is polymer, a polymer backbone of the conjugated organic polymer may extend lengthwise between the electrodes 218 and 212 (e.g., generally substantially perpendicular to the inner, facing surfaces of the electrodes 218 and 212). The conjugated organic molecule can be linear or branched such that the backbone retains its conjugated nature. Such conjugated molecules have overlapping π orbitals and can assume two or more resonant structures. The conjugated nature of the conjugated organic materials contributes to the controllably conductive properties of the selectively conductive media.

In this connection, the conjugated organic material of the active layer 216 has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material employed as part of the active layer 216 according to one aspect of the present invention can be cyclic or acyclic. For some cases, such as organic polymers, the organic material can self assemble on bottom electrode during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

The electrode 218 is formed on/over the organic material of the active layer 216 and/or the passive layer 214. The electrode 218 can be comprised of similar material as described supra for the electrode 212. Additionally, alloys with phosphorous, nitrogen, carbon, and boron, graphite, conductive oxides and other conductive substances can also be employed.

The thickness of electrode 212 and electrode 218 can vary depending on the implementation and the memory cell being constructed. However, some exemplary thickness ranges include about 0.01 μm or more and about 10 μm or less, about 0.05 μm or more and about 5 μm or less, and/or about 0.1 μm or more and about 1 μm or less.

The active layer 216 and the passive layer 214 can be collectively referred to as a selectively conductive media or a selectively conductive layer. Conductive properties of such media (e.g., conductive, non-conductive, semi-conductive) can be modified in a controlled manner by applying various voltages across the media via the electrodes 218 and 212.

The organic layer that can form the active layer 216, according to one particular aspect of the present invention has a suitable thickness that depends upon the chosen implementations of memory stack 200. Some suitable exemplary ranges of thickness for the organic polymer layer, which in part can form the active layer 216, are about 0.001 μm or more and about 5 μm or less, about 0.01 μm or more and about 2.5 μm or less, and about a thickness of about 0.05 μm or more and about 1.5 μm or less. Similarly, the passive layer 214 has a suitable thickness that can vary based on the implementation and/or memory cell being fabricated. Some examples of suitable thicknesses for the passive layer 214 are as follows: a thickness of about 2 Å or more and about 0.1 μm or less, a thickness of about 10 Å or more and about 0.05 μm or less, and a thickness of about 50 Å or more and about 0.01 μm or less.

In order to facilitate operation of the memory cell 210, the active layer 216 is generally thicker than the passive layer 214. In one aspect, the thickness of the active layer is from about 0.1 to about 500 times greater than the thickness of the passive layer. It is appreciated that other suitable ratios can be employed in accordance with the present invention. It is to be appreciated that the various layers employed in fabricating the memory cell can themselves comprise a plurality of sub layers.

Figure 3:
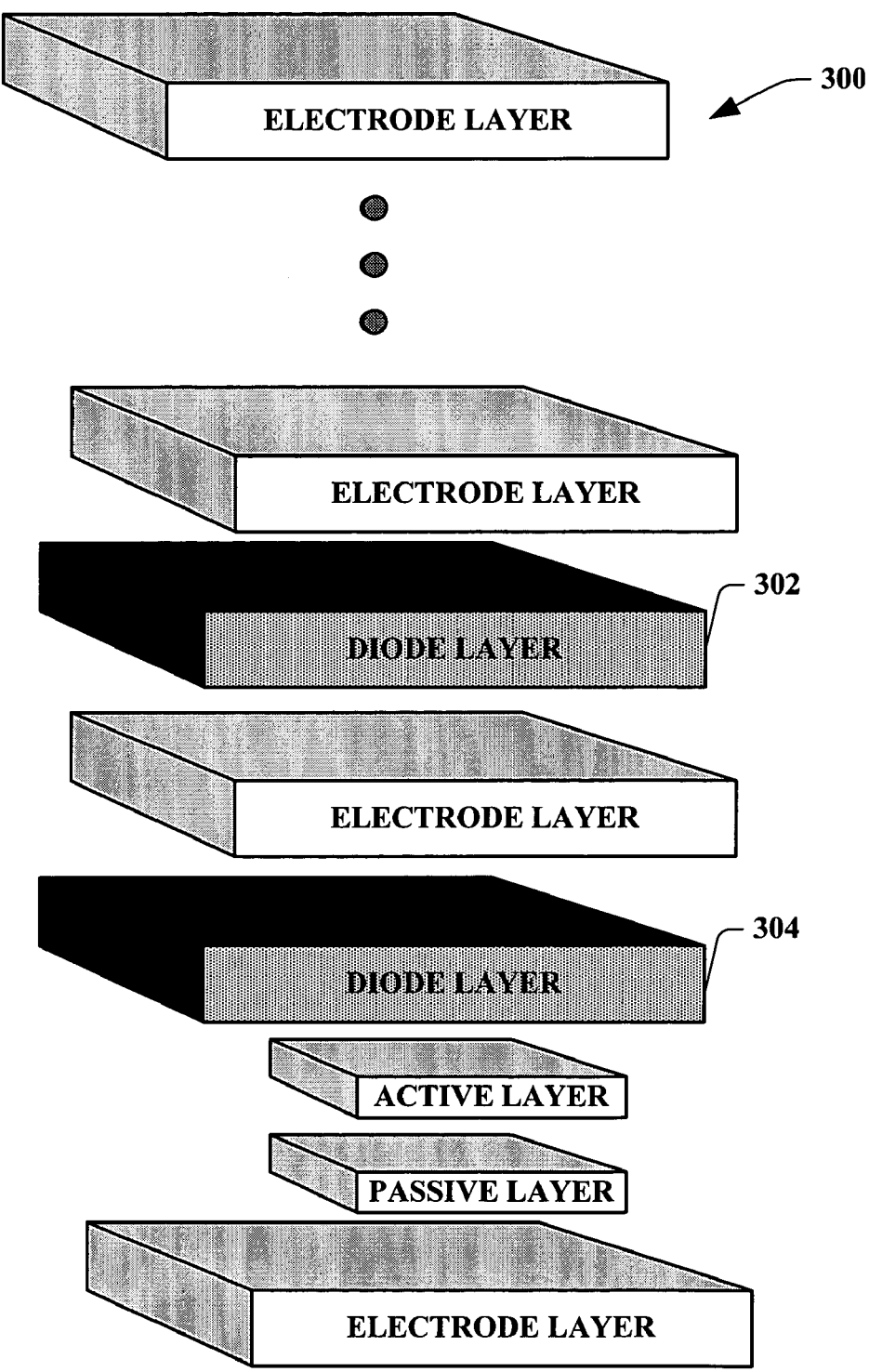
FIG. 3 illustrates another perspective of a three dimensional memory cell stack that employs diode layers.

Referring now to FIG. 3, the memory structure 300 according to the present invention can also be stacked vertically by employing diode layers 302 between memory cells, and/or diode layer 304 as part of an individual memory cell structure. Accordingly, a memory cell stack arrangement can be obtained wherein state changes can occur at desired segments of a memory stack structure. The diode layers 302, 304 can function as an electrical diode to control amount of current flowing through a memory stack or an individual memory-cell block, when a voltage is applied thereto. Such layers can for example exhibit characteristics of zener-type diodes, wherein a breakdown voltage level can be inherently predetermined by a composition of the diode. Such breakdown voltage value can be chosen to allow a specific operational function (e.g. write/read/erase) to result in the stacked polymer memory structure.

Figure 4:
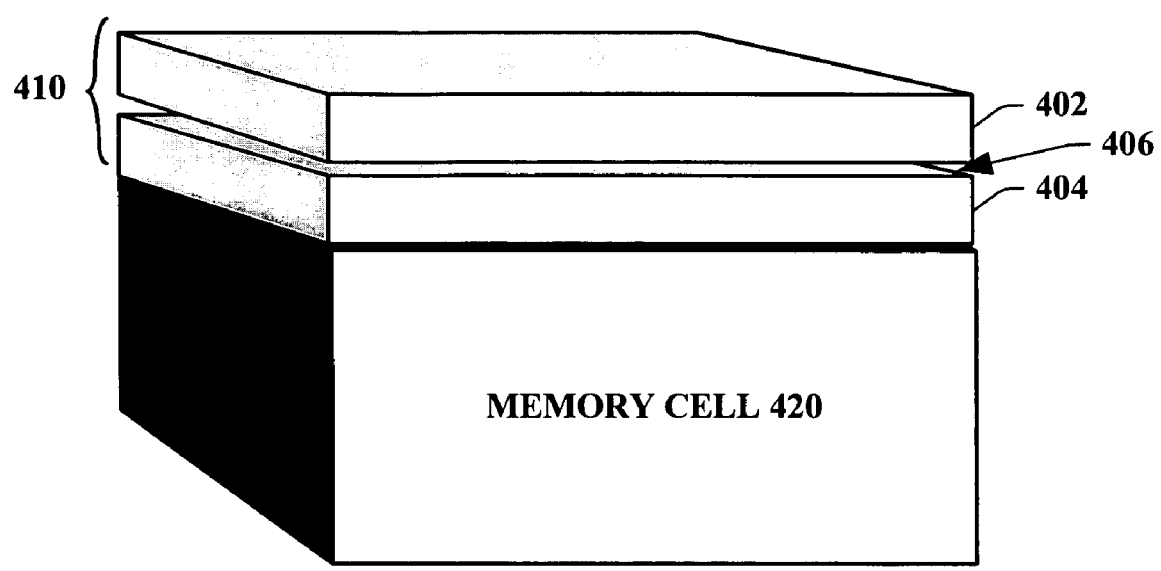
FIG. 4 illustrates a broken perspective of a diode layer coupled to a polymer memory cell, as part of a building block for a stackable memory device structure according to one aspect of the present invention.

FIG. 4 illustrates a broken perspective of a diode layer 410 coupled to a polymer memory cell 420, which can constitute a building block for a stackable memory device structure according to one aspect of the present invention. The diode layer 410 comprises a first layer 402 and a second layer 404. A diodic junction 406 can be created between the first and second layers 402, 404 due to a difference in work function between the materials of the two layers and/or due to a charge exchange between the two layers.

The first and second layers 402, 404 can be deposited on a polymer memory cell 420 in any manner that maintains the diodic junction 406. Such can for example include chemical vapor deposition (CVD) processes e.g. atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) can also be employed.

The first layer 402 can be comprised of a material that produces a desired diodic junction 406, when working in conjunction with the second layer 404. Accordingly, its composition can be paired appropriately with the second layer 404 composition. The first layer 402 can be a thin or multi-thin film layer. Its composition can be polysilicon, organic and inorganic conductor, crystal state semiconductor, and amorphous state semiconductor material and the like.

The second layer 404 can be comprised of materials necessary to form required diodic junction 406 with the first layer 402. Such desired junction can be a silicon based p-n junction, an organic semiconductor based junction, a metal based organic semiconductor junction, a silicon p- or n-type based organic semiconductor junction and the like. It is to be appreciated that the composition of the second layer 404 can be any number of appropriate materials that when forming a junction with the first layer 402 achieves desired diodic characteristics.

Selecting materials with the appropriate work function differences and/or charge characteristics can alter the diodic effect produced by the two layers 402, 404. Work function is the energy needed to move electrons in the solid from the Fermi level to vacuum level. The work function difference is the characteristics of the contact between the two materials that have differing work functions, defining ohmic or rectifying contact.

In one aspect of the present invention, the second layer 404 can be comprised of a conductive material such as, aluminum, chromium, copper, germanium, gold, magnesium, manganese, indium, iron, nickel, palladium, platinum, silver, titanium, zinc, tungsten, chrome, alloys thereof, indium-tin oxide, polysilicon, doped amorphous silicon, metal nitrides, carbides, silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the second layer 404 can vary depending on the implementation and the semiconductor device being constructed. However, some exemplary thickness ranges include about 0.01 µm or more and about 10 µm or less, about 0.05 µm or more and about 5 µm or less, and/or about 0.1 µm or more and about 1 µm or less.

The diodic layer 410 can control amount of current that flows through the polymer memory cell 420, when a voltage is applied via control circuitry (not shown) across various layers of the polymer memory cell 420, or a group of such memory cells stacked upon each other. Diode characteristics of diodic layer 406 determine how much voltage is required to produce a given amount of current through polymer memory cell 420. It is to be appreciated that there are a wide range of different types of diodes (including Schottky diodes and the like) that provide numerous differing diode characteristics, allowing an almost infinite capability to fine tune the desired regulating effect.

Figure 5:
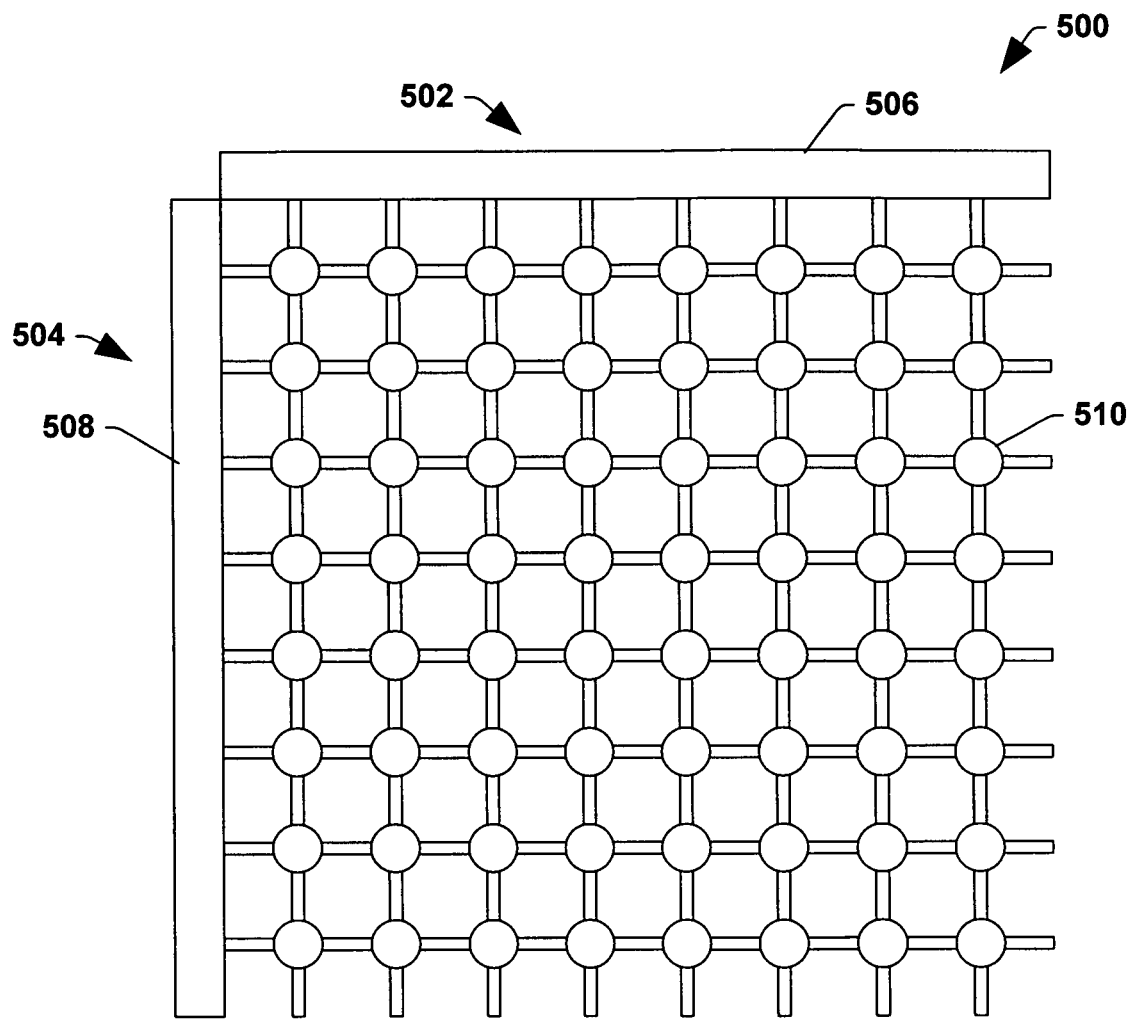
FIG. 5 shows a top plan view of an array of memory cell stacks in accordance with an aspect of the present invention.

Turning to FIG. 5, a top view 500 of cylindrical memory cell stacks in accordance with an aspect of the present invention is illustrated. Such an array is generally formed on a silicon-based wafer, and includes a plurality of columns (e.g. 502) referred to as bitlines, and a plurality of rows (e.g. 504) referred to as wordlines. Such bit line and wordlines can be connected to the top and bottom metal layers of the memory component. The intersection of a bitline and a wordline constitutes the address of a particular memory cell in a memory cell stack. Data can be stored in such memory cells (e.g., as a 0 or a 1) by choosing and sending signals to appropriate columns and rows in the array (e.g., via a column address strobe (CAS) 506 and a row address strobe (RAS) 508, respectively). For example, the state (e.g., a 0 or a 1) of the memory cell on the surface of a three dimensional stacked memory structure indicated at 510 is a function of the $3^{rd}$ row and $8^{th}$ column of the array 500. In dynamic random access memory (DRAM), for example, memory cells include transistor-capacitor pairs. To write to a memory cell, a charge can be sent to the appropriate column (e.g., via CAS 506) to activate the respective transistors in the columns, and the state that respective capacitors should take on can be sent to the appropriate columns (e.g., via RAS 508). To read the state of the cells, a sense-amplifier can determine the level of charge on the capacitors. If it is more than 50 percent, it can be read as a 1; otherwise it can be read as a 0. It is to be appreciated that while the array 500 illustrated in FIG. 5 includes 64 memory cell stacks (e.g., 8 rows×8 columns), the present invention has application to any number of memory cell stacks or any number of memory cells included in each stack and is not to be limited to any particular configuration, arrangement and/or number of memory cells.

Figure 6:
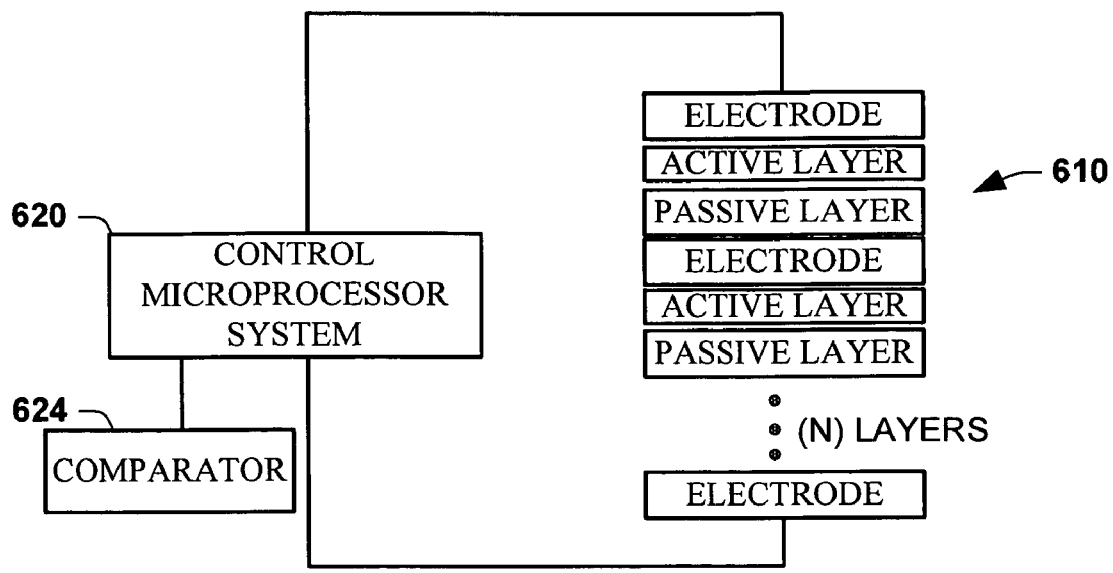
FIG. 6 illustrates a schematic control system for programming a memory cell stack arrangement, according to one aspect of the present invention.

FIG. 6 illustrates a schematic programming system for a memory cell stack with at least N layers (N being an integer) associated with a plurality of polymer memory cells stacked on top of each other, wherein a controller for programming the memory cell stack comprises a microprocessor 620. The microprocessor 620 can be part of a suitably programmed general purpose computer of a network and can also be implemented by employing a plurality of separated dedicated programmable integrated or other logic devices. Other information display devices (e.g. monitors, displays and the like), as well as user input devices can be operatively connected to the input/output of such processor. The processor 620 can actively trace and control a program state for each memory cell of the memory cell stack 610, by applying an external stimulus to the memory cell. For example, the microprocessor system 620 can provide a programming signal, e.g. a voltage applied to the a particular memory cell, which is part of the memory stack 610, and detect an ensuing electric current that flows through it. When such current is detected to be at a predetermined value that represents a particular resistance of that particular memory cell, the voltage can be removed, and programming stopped. Such can be accomplished by comparing the current via a comparator 624 to reference values. Accordingly, various memory cells of the memory cell stack 610 can be programmed to a predetermined state. Likewise, by applying a reverse signal, e.g. reverse voltage, information of that state can be erased from such memory cell.

As such, the presence of an external stimuli such as an applied voltage or electric field that exceeds a threshold value (e.g. "on" state) permits the writing information into the memory cells 610; whereas the absence of the external stimuli that exceeds a threshold value ("off" state) prevents erase of information from the memory cells 610. Similarly, to read information from the memory cell stack 610, a voltage or electric field (e.g., 2 volts, 1 volts, 0.5 volts) can be applied via the control microprocessor system 620. Subsequently, an impedance measurement can be performed which, therein determines which operating state one or more of the memory cells as part of the stack 610 are in (e.g., high impedance, very low impedance, low impedance, medium impedance, and the like). As stated supra, the impedance relates to, for example, "on" (e.g., 1) or "off" (e.g., 0) for a dual state device, or to "00", "01", "10", or "11" for a quad state device. It is appreciated that other numbers of states can provide other binary interpretations. To erase information written into the memory cell stack 610, a negative voltage or a polarity opposite the polarity of the writing signal that exceeds a threshold value can be applied.

The control microprocessor system 620 in connection with programming the memory cell stack 610 can employ various artificial intelligence based components or schemes for carrying out various aspects thereof. For example, a process for learning explicitly or implicitly when a particular memory cell of the three dimensional stack 610 should be provided with a signal that initiates a write, read, or erase, can be facilitated via an automatic classification system and process. In addition, tracing of an affected feature associated (e.g. current and/or voltage) with a particular memory cell can be accomplished via such artificial intelligence component. Classification can employ a probabilistic and/or statistical-based analysis (e.g., factoring into the analysis utilities and costs) to prognose or infer an action on a particular memory cell that is desired to be automatically performed. For example, a support vector machine (SVM) classifier can be employed. Other classification approaches include Bayesian networks, decision trees, and probabilistic classification models providing different patterns of independence can be employed. Classification as used herein also is inclusive of statistical regression that is utilized to develop models of priority. As will be readily appreciated from the subject specification, the subject invention can employ classifiers that are explicitly trained (e.g., via a generic training data) as well as implicitly trained (e.g., via receiving extrinsic information) so that the classifier is used to automatically determine according to a predetermined criteria what action to perform, or which answer to return to a question. For example, with respect to SVM's that are well understood, SVM's are configured via a learning or training phase within a classifier constructor and feature selection module. A classifier is a function that maps an input attribute vector, x=(x1, x2, x3, x4, xn), to a confidence that the input belongs to a class—that is, f(x)=confidence (class). As used in this application, the terms "component" and "system" are also intended to refer to a computer-related entity, either hardware, a combination of hardware and software, software, or software in execution. For example, a component can also be, but is not so limited, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. It is to be appreciated that filters, minifilters, filter managers, classifiers, models, order groups and other various items are components.

Figure 7:
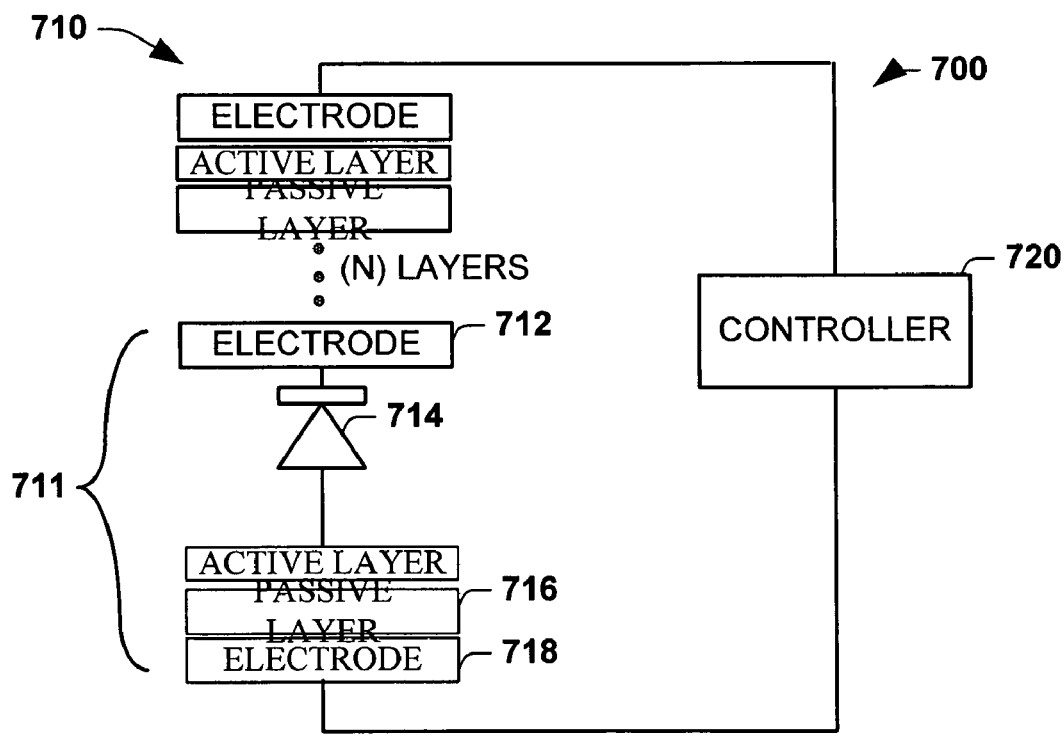
FIG. 7 illustrates a block diagram for a control circuitry according to one aspect of the present invention.

FIG. 7 illustrates a schematic block diagram of data processing system 700 with a memory cell stack 710 employing a diode 714, in accordance with an aspect of the present invention. Controller 720, which can include a logic component, can program the memory cell stack 710. The diode itself can form a layer and comprise electrode layer(s) with organic and/or non-organic material, and can be part of: an individual memory cell, and/or a partitioning component between individual memory cells of the memory stack 710. Accordingly, the memory cell stack 710 can be programmed by a signal that applies a forward bias (or a reverse bias). For example, in case of a reverse bias programming, the controller 720 can apply a reverse bias voltage that exceeds the diode 714 breakdown voltage and create an electric field (or a current) between electrodes. It is to be appreciated that that the diode 714 can also be separate of the memory cell structure.

Figure 8:
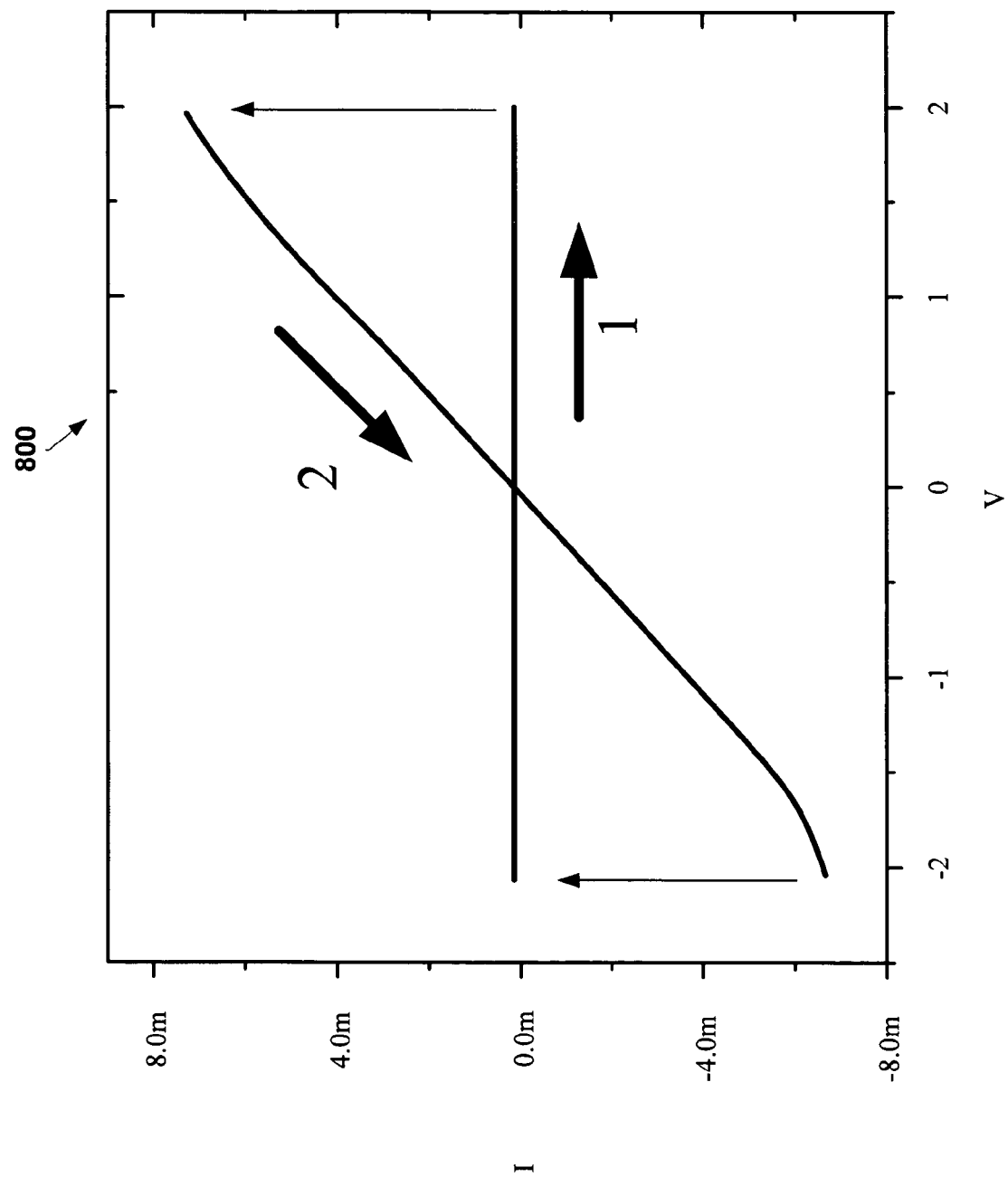
FIG. 8 illustrates a graph illustrating I-V characteristics for an individual polymer memory cell, which can shape a building block of a memory cell stack in accordance with an aspect of the present invention.

FIG. 8 is a graph 800 that illustrates an I-V characteristic for an individual memory cell, which can act as a building block for a three dimensional pillar stack in accordance with an aspect of the present invention. From such figure, it can be seen that from state 1, which indicates "off", the device can be modified to be in state 2, which indicates "on", by applying a positive voltage. Additionally, it can be seen that whilst in state 1, the organic memory device has a high impedance and low conductance. Subsequently, the device can be modified to change from state 2 to state 1 by application of a negative voltage, therein causing a reverse current until the state 1 is obtained.

Figure 9:
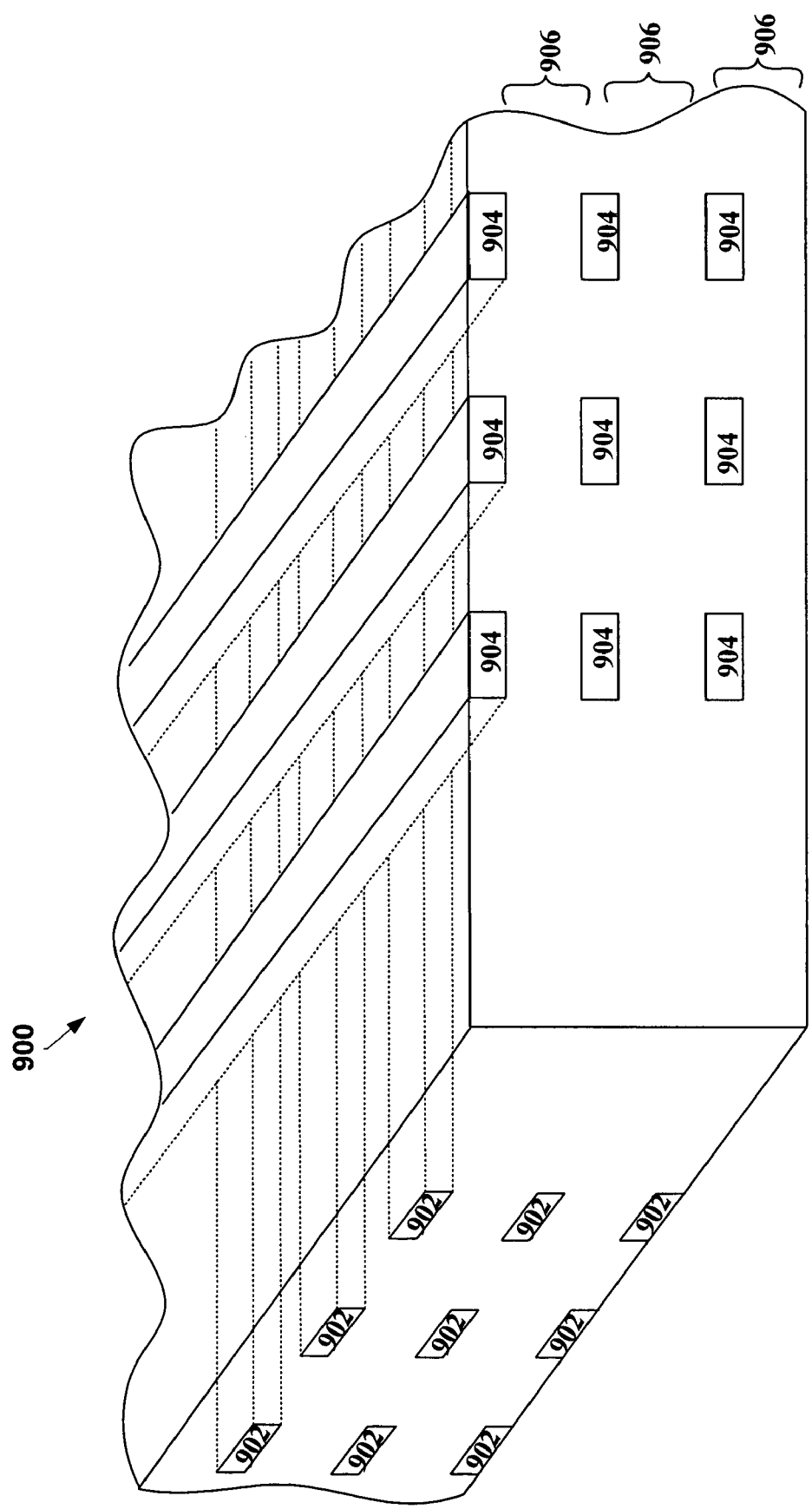
FIG. 9 is a view of a memory device employing various electrode lines in a crossed shape according to an aspect of the present invention.

Referring to FIG. 9, a three dimensional view of a memory device 900 containing a plurality of memory cells stacked in accordance with an aspect of the invention is shown. The memory device 900 contains a plurality of electrodes 902, a plurality of second electrodes 904, wherein various stacked memory cell arrangements 906 can be fabricated therebetween. The plurality of electrodes 902 and 904 are shown in substantially perpendicular orientation, although other orientations are possible. Such microelectronic memory device is capable of containing an extremely high number of three dimensional memory cell pillared stacks, thereby improving device density. Peripheral circuitry and devices are not shown for brevity.

To read information from the memory device, a voltage or electric field (e.g., 2 volts, 1 volt, 0.5 volts) is applied via a voltage source. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

Figure 10:
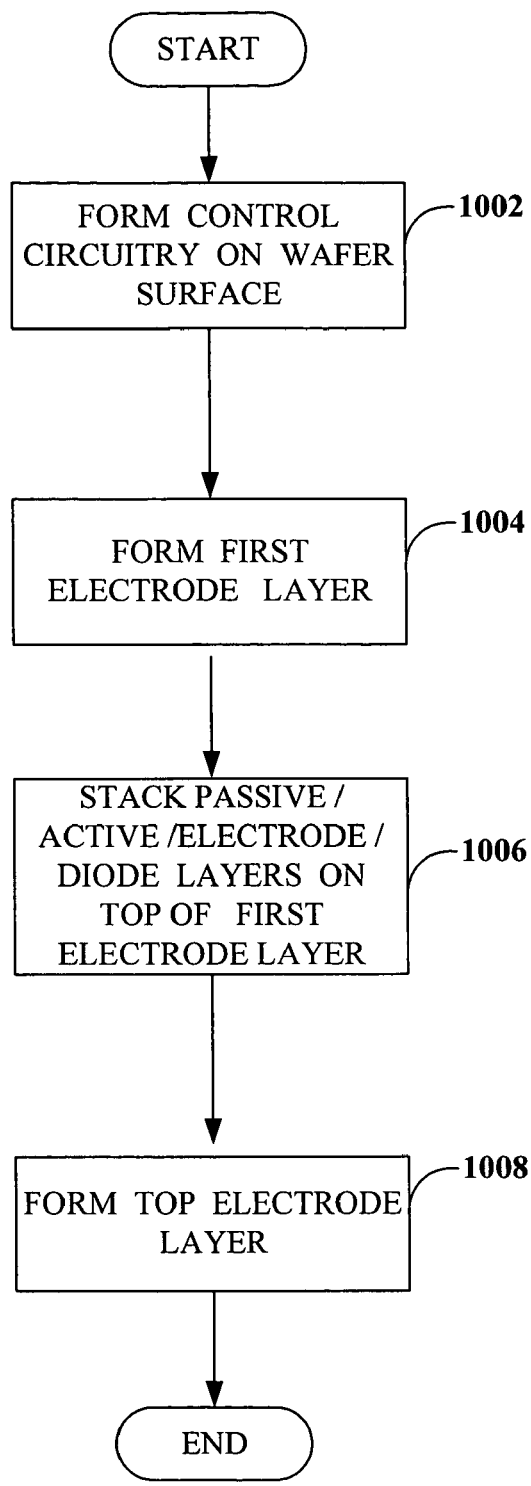
FIG. 10 illustrates a flow chart for a methodology according to the present invention.

FIG. 10 illustrates a methodology according to one aspect of the present invention. While the exemplary method is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. In addition, not all illustrated blocks, events or acts, can be required to implement a methodology in accordance with the present invention. Moreover, it will be appreciated that the exemplary method and other methods according to the invention may be implemented in association with a deposition and etch process for IC fabrication, and/or a damascene fill and polish procedure as well as in association with other systems and apparatus not illustrated or described.

Initially, at 1002 a control component circuitry, as described in detail supra can be deposited on a wafer surface. Such control component can facilitate a programming of various memory cells employed as part of the pillared memory cell of the present invention. Next, and at 1004 a bottom conducting layer is being deposited, e.g., as part of an interconnect line as described in detail supra, which acts as a lower electrode of the memory stacked pillar. Next at 1006 various layers of: passive media, active media, diodes, electrode layers are deposited in form of stacks on top of each other. At 1008, and over such stacked layers, which is formed of a plurality of memory cells, a top metal layer can be deposited, e.g., as part of an interconnect line to connect such three dimensional stack with other parts of a circuit.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention. Furthermore, to the extent that the terms "includes", "including", "has", "having", and variants thereof are used in either the detailed description or the claims, these terms are intended to be inclusive in a manner similar to the term "comprising."

What is claimed is:

1. A polymer memory system comprising:
    a plurality of polymer memory cells stacked in a non-horizontal orientation on top of each other over a wafer surface, the stack of memory cells formed at an intersection of a first electrode and an adjacent second electrode, the electrodes oriented substantially perpendicular to each other; and
    a control component formed on the wafer surface, the control component programs a polymer memory cell of the plurality of polymer memory cells to a desired state, based on a change of impedance associated with the polymer memory cell.

2. The polymer memory system of claim 1, the non-horizontal orientation is vertical.

3. The polymer memory system of claim 1, the polymer memory cell comprises an active layer and a passive layer that are sandwiched between electrode layers.

4. The polymer memory system of claim 3, at least one of the electrode layers comprise of a material selected from the group of tungsten, silver, copper, titanium, chromium, germanium, gold, aluminum, magnesium, manganese, indium, iron, cobalt, tantalum, nickel, palladium, platinum, zinc, alloys thereof, polysilicon, doped amorphous silicon, and copper composition alloys.

5. The polymer memory system of claim 3, at least one of the electrode layers comprise of a material selected from the group of conducting polymers, semi-conducting polymers, PEDOT/PSS, polyaniline, polythiothene, polypyrolle, doped conducting organic polymers, doped semiconducting organic polymers, undoped conducting organic polymers, undoped semiconducting organic polymers, oligomers, and monomers.

6. The polymer memory system of claim 3, at least one of the electrode layers comprise of a material selected from the group of indium-tin oxide, conducting metal oxides, conducting metal nitrides, conducting metal silicides, semiconducting metal oxides, semiconducting metal nitrides, and semiconducting metal silicides.

7. The polymer memory system of claim 3, at least one of the electrode layers comprise of amorphous carbon.

8. The polymer memory system of claim 3, the passive layer exchanges charged particles with the active layer.

9. The polymer memory system of claim 8, the passive layers comprise of a material selected from the group of tungsten oxide (WO3), molybdenum oxide (MoO3), titanium dioxide (TiO2), copper sulfide (CuxS), and silver sulfide (Ag2S).

10. The polymer memory system of claim 3, the active layer comprises at least one selected from the group of polydiphenylacetylene, poly(t-butyl)diphenylacetylene, poly(trifluoromethyl)diphenylacetylene, polybis-trifluoromethyl)acetylene, polybis(t-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitro-phenylacetylene, poly(trifluoromethyl)phenylacetylene, poly(trimethylsilyl)pheylacetylene, polydipyrrylmethane, polyindoqiunone, polydihydroxyindole, polytrihydroxyindole, furane-polydihydroxyindole, polyindoqiunone-2-carboxyl, polyindoqiunone monohydrate, polybenzobisthiazole, and poly(p-phenylene sulfide).

11. The polymer memory system of claim 3, the active layer comprises at least one of: materials of a nitro group, materials of an amino group, cyclopentadienyl, dithiolane, methylcyclopentadienyl, fulvalenediyl, indenyl, fluorenyl, cyclobis(paraquart-p-phenylene), bipyridyl, bithienyl, thienyl, pyridyl, phenantryl, dialkylbenzyl, phenothiazine, diazapyrenium, benzonitrile, benzonate, benzamide, carbazole, dibenzothiophene, nitrobenzene, aminobenzenesulfonate, aminobenzoate, and co-polymers of thereof, molecular units with redox-active metals; metallocenes complex, and polypyridine metal complex.

12. The polymer memory system of claim 1 further comprising a diode.

13. The polymer memory system of claim 1 the control component comprises an artificial intelligence unit.

14. A polymer memory system comprising:
    a plurality of polymer memory cells placed on top of each other to form a stacked pillar, the stacked pillar extending between a first electrode and an adjacent second electrode, the first and second electrodes are oriented substantially perpendicular to each other; and
    a control component that forms a base for the stacked pillar, the control component programs a polymer memory cell of the plurality of polymer memory cells via an external stimulus applied to the polymer memory cell.

15. The polymer memory system of claim 14, the stimulus is a voltage applied to the memory cell.

16. The polymer memory system of claim 14, the stimulus is an electric current that flows through the memory cell.

17. The polymer memory system of claim 14, the polymer memory cell comprises an active layer with redox-active metals.

18. The polymer memory system of claim 14, the control component comprises a comparator that compares a current flowing through the polymer memory cell with a reference value.

\* \* \* \* \*